United States Patent
Wu

(10) Patent No.: US 6,211,016 B1
(45) Date of Patent: *Apr. 3, 2001

(54) METHOD FOR FORMING HIGH DENSITY NONVOLATILE MEMORIES WITH HIGH CAPACITIVE-COUPLING RATIO

(75) Inventor: Shye-Lin Wu, Hsinchu (TW)

(73) Assignee: Texas Instruments-Acer Incorporated, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 09/283,406

(22) Filed: Apr. 1, 1999

Related U.S. Application Data

(63) Continuation-in-part of application No. 09/046,343, filed on Mar. 23, 1998, now Pat. No. 6,127,698.

(51) Int. Cl.$^7$ .................. H01L 21/336; H01L 21/4763; H01L 21/44; H01L 29/76
(52) U.S. Cl. ............... 438/264; 438/263; 438/649; 438/655; 257/288
(58) Field of Search ................. 438/257, 260, 438/263, 264, 721, 722, 649, 655; 257/288

(56) References Cited

U.S. PATENT DOCUMENTS

| | | | |
|---|---|---|---|
| 4,562,638 | * | 1/1986 | Schwabe et al. ............... 29/577 |
| 4,833,099 | * | 5/1989 | Woo ............................ 437/41 |
| 5,182,232 | * | 1/1993 | Chhabra et al. .............. 437/200 |
| 5,504,022 | * | 4/1996 | Nakanishi et al. ............ 437/43 |
| 5,814,856 | * | 9/1998 | Bergemont et al. ........... 257/319 |
| 5,970,342 | * | 10/1999 | Wu ............................. 438/260 |
| 6,043,124 | * | 3/2000 | Wu ............................. 438/260 |

* cited by examiner

*Primary Examiner*—Matthew Smith
*Assistant Examiner*—Lex H. Malsawma

(57) ABSTRACT

A method for fabricating a high speed and high density nonvolatile memory cell is disclosed. First, a semiconductor substrate with defined field oxide and active region is prepared. A stacked silicon oxide/silicon nitride layer is deposited and then the tunnel oxide region is defined. A thick thermal oxide is grown on the non-tunnel region. After removing the masking silicon nitride layer, the source and drain are formed by an ion implantation and a thermal annealing. The pad oxide film is etched back, and a metal silicide film is formed and then stripped. A topography of the doped substrate region is then made rugged. Thereafter, a thin oxide is grown on the rugged doped substrate region to form a rugged tunnel oxide. Finally, the floating gate, the interpoly dielectric, and the control gate are sequentially formed, and the memory cell is finished.

19 Claims, 4 Drawing Sheets

METHOD FOR FORMING HIGH DENSITY NONVOLATILE MEMORIES WITH HIGH CAPACITIVE-COUPLING RATIO

CROSS REFERENCE TO RELATED APPLICATIONS

This invention is a continuation-in-part application Serial No. of 09/046,343 now U.S. Pat. No. 6,127,698 Mar. 23, 1998, titled "High Density/Speed Nonvolatile Memories with a Textured Tunnel Oxide and a High Capacitive-Coupling Ratio", and assigned to same assignee with the same inventor as the present application.

FIELD OF THE INVENTION

The present invention relates to a method for fabricating a nonvolatile memory cell, and more especially, to a method for fabricating rugged tunnel oxide with high electron injection efficiency and a large charge-to-breakdown for low power nonvolatile memory.

BACKGROUND OF THE INVENTION

Nonvolatile memories, including mask read-only memories (Mask ROM), programmable ROM (PROM), erasable programmable ROM (EPROM), electrically erasable programmable ROM (EEPROM or $E^2$PROM) and flash memories, retain their memory data whenever the power is turned off, and have wide applications in the computer and electronic industry. In recent years, the markets of the portable computers and telecommunications have developed rapidly and have become a major driving force in the design and technology of the semiconductor integrated circuit. As stated by A. Bergemont, et al., in "Low Voltage NVG™: A New High Performance 3 V/5 V Flash Technology for Portable Computing and Telecommunications Application", IEEE Trans. Electron Devices Vol. 43, p. 1510 (1996), there is a great need for low power, high density, and electrically re-writable nonvolatile memories. That is, the memories programmable and erasable as EPROM, $E^2$PROM or flash memories are required for the aforementioned systems to store operating systems or application software.

The basic storage cell of these programmable and erasable memories contains a double polysilicon storage transistor with a floating gate isolated in silicon dioxide and capacitively coupled to a second control gate which is stacked above it. The $E^2$PROM cell further comprises an access, or select, transistor. These memories execute the programming and erasure by charging or discharging their floating gates. For example, the EPROM is programmed by hot electron injection at the drain to selectively charge the floating gate and erased by discharging the floating gate with ultraviolet light or X-ray, which the latter has never been commercially applied for this purpose. The $E^2$PROM and most of the flash memories are programmed by hot electron injection or cold electron tunneling named Fowler-Nordheim tunneling, and erased mostly by Flower-Nordheim tunneling from the floating gate to the source, with the control gate ground.

Flower-Nordheim tunneling, or cold electron tunneling, is a quantum-mechanical effect, which allows the electrons to pass through the energy barrier at the silicon-silicon dioxide interface at a lower energy than required to pass over it. H. Shirai, et al., stated in their paper "A 0.54 $\mu m^2$ Self-Aligned, HSG Floating Gate Cell for 256 Mbit Flash Memories", IEDM Tech. Dig. Vol. 95, p. 653 (1995) that, because of its low current consumption, the Fowler-Nordheim program/erase scheme becomes indispensable for low power operation of the $E^2$PROM and flash memories. However, the Fowler-Nordheim program/erase scheme requires high voltage applied to control gate of the memory cell. This high voltage is needed for inducing a large reversible electric field to the thin oxide that separates the floating gate from the substrate. Therefore, to lower the control gate bias, the memory cell must have a high capacitive-coupling ratio structure.

Y. S. Hisamune, et al., propose a method for fabricating a flash memory cell with contactless array and high capacitive-coupling ratio in "A High Capacitive-Coupling Ratio Cell for 3 V-Only 64 Mbit and Future Flash Memories", IEDM Tech. Dig. Vol. 93, p. 19 (1993). However, this method achieves high capacitive-coupling ratio with four times polysilicon deposition and has a complex fabrication. In addition, this cell structure makes it difficult to scale the size down and increase the integration of the memory due to its short tunnel oxides. Furthermore, as mentioned by C. J. Hegarty, et al., in "Enhanced Conductivity and Breakdown of Oxides Grown on Heavily Implanted Substrates", Solid-State Electronics, Vol. 34, p. 1207 (1991), it is also difficult to fabricate a thin tunnel oxide on the heavily doped substrate with a high electron injection efficiency and a large charge-to-breakdown for low power nonvolatile memories. Thus, to reach high capacitive-coupling ratio, high electron injection efficiency and a large charge-to-breakdown with a simple manufacture is the subject of high density and low power nonvolatile memories today.

SUMMARY OF THE INVENTION

A method for fabricating a nonvolatile memory cell with rugged tunnel oxide is disclosed. First, the field oxide is formed, the active region is defined, and a semiconductor substrate is prepared. A stacked silicon oxide/silicon nitride layer is deposited on the substrate and then the tunnel oxide region is defined by a standard photolithography process followed by an anisotropic etching. A high temperature steam oxidation process is used to grow a thick thermal oxide on the non-tunnel region. After removing the masking silicon nitride layer, the phosphorus ions are implanted to form the doped regions and serve as source and drain, then a thermal annealing is performed to recover the implantation damage and to drive in the doped ions. Next, the pad oxide film is etched back, and a metal silicide film is formed and then stripped. A rugged topography of the doped substrate region is then formed. Thereafter, a thin oxide is grown on the rugged doped substrate region to form a rugged tunnel oxide. Finally, the first n+ doped polysilicon film which serves as the floating gate, the interpoly dielectric such as NO or ONO, and the second n+ doped polysilicon film which serves as the control gate are sequentially formed, and the memory cell is finished.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention proposes a simple method to fabricate a nonvolatile memory cell with high capacitive-coupling ratio. The method described here includes many process steps well known in the art like photolithography, etching or chemical vapor deposition (CVD) which are not discussed in detail. In addition, the present invention utilize a method for forming a rugged tunnel oxide to attain high electron injection efficiency and a large charge-to-breakdown for low power nonvolatile memories.

Figure 1:
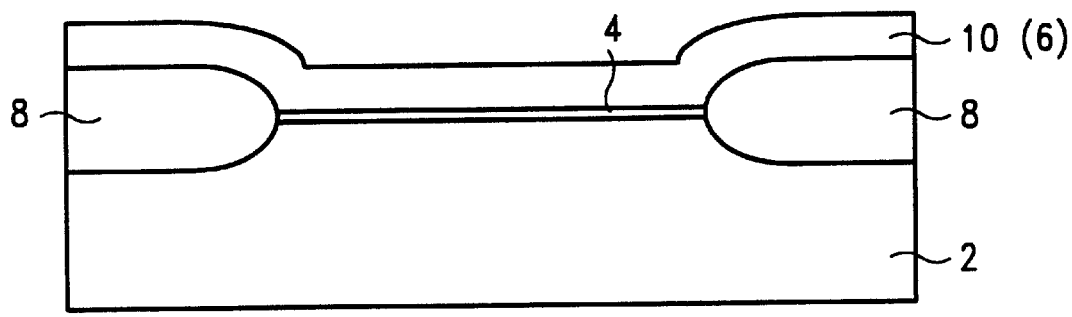
FIG. 1 is a cross-sectional view of a semiconductor wafer illustrating the step of forming a silicon oxide layer and a silicon nitride layer on th substrate according to the present invention.

Referring to FIG. 1, a single crystal silicon substrate 2 with a <100> crystallographic orientation is provided. A silicon oxide layer 4 is formed on the surface of the substrate 2. In addition to a pad oxide for the oxidation mask, the silicon oxide layer 4 can be used to act as a sacrificial oxide to prevent the channel effect during the later ion implantation. This pad oxide layer 4 has a thickness of about 40–300 angstroms, and can be grown by using thermal oxidation at a temperature of about 800–1100° C., or using low pressure chemical vapor deposition (LPCVD) at a temperature of about 400–750° C. Next, a thick silicon nitride layer 6 is deposited, for example, using a LPCVD process at a temperature of about 700–800° C., on the pad oxide layer 4 to serve as an oxidation mask.

The field oxide (FOX) pattern is now defined using a conventional manner of photolithography including photoresist coating, exposure, and development processes, and then a dry etching is carried out to etch the thick silicon nitride layer 6 and the pad oxide layer 4. After photoresist is removed and wet cleaned, a thermal oxidation in an oxygen steam environment is performed, and the thick field oxide regions 8 are grown with a thickness of about 3000–8000 angstroms to provide isolation between active regions on the substrate 2. Then, the silicon nitride layer 6 is optionally removed, and a new silicon nitride layer 10 is created over the substrate 2.

Figure 2:
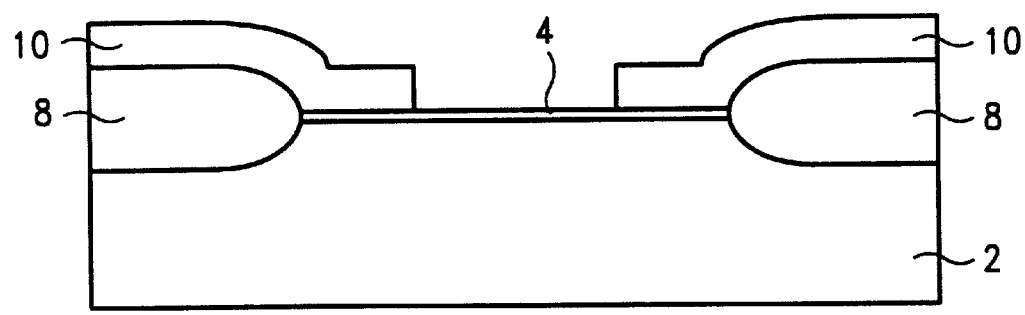
FIG. 2 is a cross-sectional view of a semiconductor wafer illustrating the step of defining the tunnel oxide regions on the substrate according to the present invention.
Figure 3:
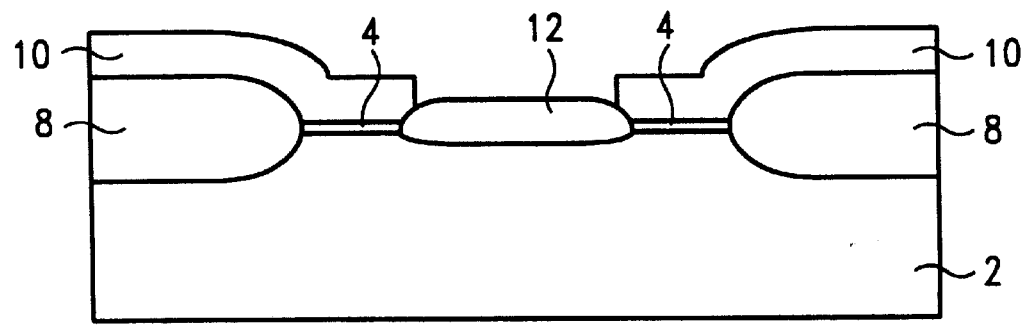
FIG. 3 is a cross-sectional view of a semiconductor wafer illustrating the step of growing a thick thermal oxide on the substrate according to the present invention.

Turning next to FIG. 2, another photolithography process is used to define the tunnel oxide region. An etching step follows to selectively etch the silicon nitride layer 10 but not the pad oxide layer 4 and expose a portion of the pad oxide layer 4 which defines the non-tunnel region on the active region. This selectivity can be reached by a dry etching process using $NF_3$ as the plasma source or by a wet etching process using hot phosphoric acid as the etching solution. It is noted that the wet etching will cause the undercut. A high temperature steam oxidation is then performed at a temperature of about 800–1100° C. to grow a thick thermal oxide 12 on the non-tunnel region, as shown in FIG. 3. This thermal oxide 12 has a thickness of about 300–2500 angstroms, and can raise the capacitive-coupling ratio of the memory cell.

Figure 4:
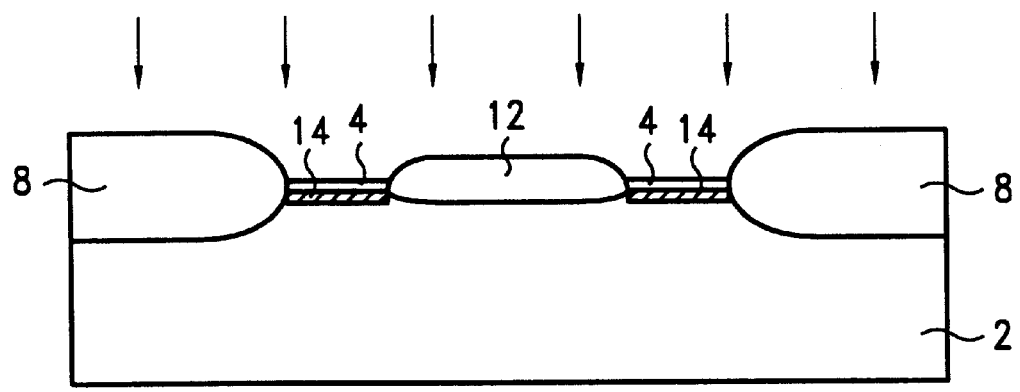
FIG. 4 is a cross-sectional view of a semiconductor wafer illustrating the step of forming the source and drain regions on the substrate according to the present invention.
Figure 5:
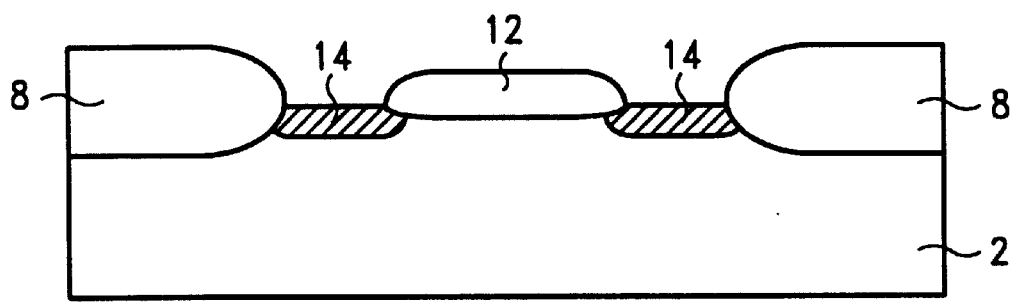
FIG. 5 is a cross-sectional view of a semiconductor wafer illustrating the step of performing a high temperature annealing and removing the pad oxide film according to the present invention.

Turning next to FIG. 4, the masking silicon nitride film 10 is removed by wet etching with hot phosphoric acid. An n+ ion implantation is performed to implant appropriate impurity ions through the silicon oxide layer 4, but not the thick oxide 12, into the substrate 2 to form doped substrate region 14 and serve as the source and drain. The implanted ions can be phosphorus ions, arsenic ions or antimony ions. The implantation energy and dosage are respectively about 0.5–150 keV and about $5\times10^{14}$–$5\times10^{16}$ atoms/cm$^2$. During the ion implantation, the silicon oxide layer 4 act as a buffer to prevent the substrate 2 from damage and to prevent the doped ions from channel effect. The substrate 2 is then thermal annealed to recover the implantation damage by a preferable method as rapid thermal processing (RTP) at a temperature of about 800–1150° C. The dopants are activated and driven in to form the best distribution profile at this step, as shown in FIG. 5. The silicon oxide 4 is now removed, with a suitable etchant such as buffered oxide-etching (BOE) solution or diluted solution of hydrofluoric acid (HF).

Next, a sacrificial metal silicide film 16 is formed over the doped regions 14 of the substrate 2. For one embodiment, the sacrificial metal silicide film 16 can be formed by metal deposition, such as sputtering, followed by a thermal process, such as high temperature annealing or rapid thermal processing (RTP). A metal such as titanium (Ti), tungsten (W), tantalum (Ta), Nickel (Ni), molybdenum (Mo), cobalt (Co), and so on, can be used as the material of precursory metal. The deposition process of precursory metal can be chosen to be either blanket or selective deposition, for example, blanket tungsten deposition or selective tungsten deposition.

Figure 6:
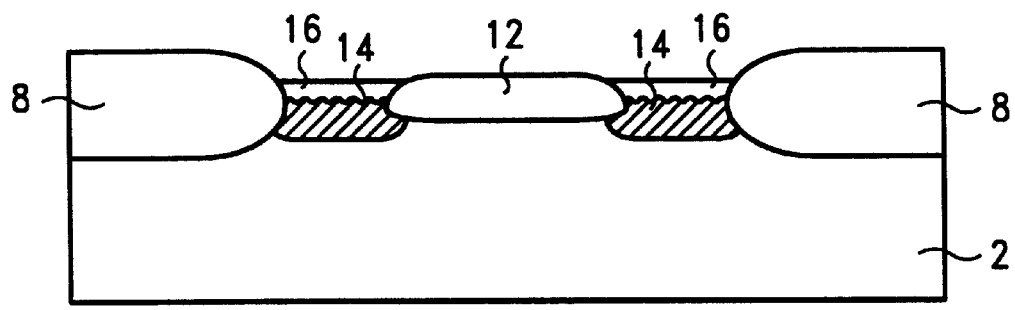
FIG. 6 is a cross-sectional view of a semiconductor wafer illustrating the step of forming a metal silicide on the substrate according to the present invention.

FIG. 6 illustrates a cross-sectional view of the substrate after a silicide forming with selective metal deposition. The embodiment with blanket metal deposition will have the same situation and produce the same topography right above the exposed substrate region 14. As illustrated in FIG. 6, a rugged interface between silicon and silicide can be formed under a suitable process condition, such as a certain substrate temperature (depending on the precursor metal used) during annealing.

Figure 7:
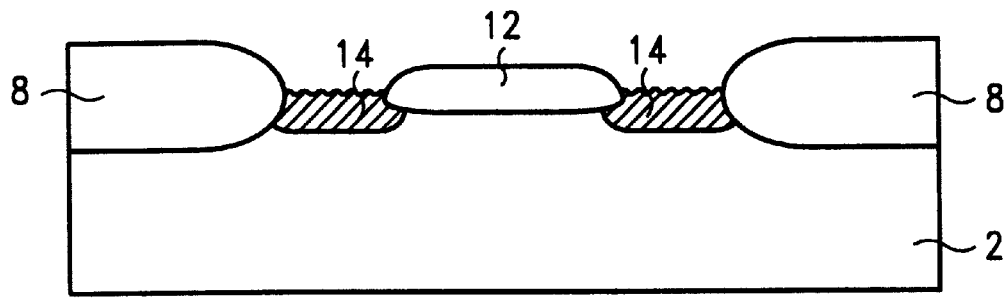
FIG. 7 is a cross-sectional view of a semiconductor wafer illustrating the step of stripping the metal silicide to form a rugged substrate surface according to the present invention.

Thereafter, the sacrificial metal silicide film 16 is stripped by a suitable etching process. The etching recipe should be applied depending on the metal precursor used. For one embodiment, a wet etching is used, and $NH_4OH/H_2O_2/H_2O$ solution can be applied to act as the etchant for etching $WSi_2$, $TiSi_2$, and $CoSi_2$. After the sacrificial metal silicide film 16 is stripped, the doped substrate region 14 is then exposed with rugged surface as shown in FIG. 7.

Figure 8:
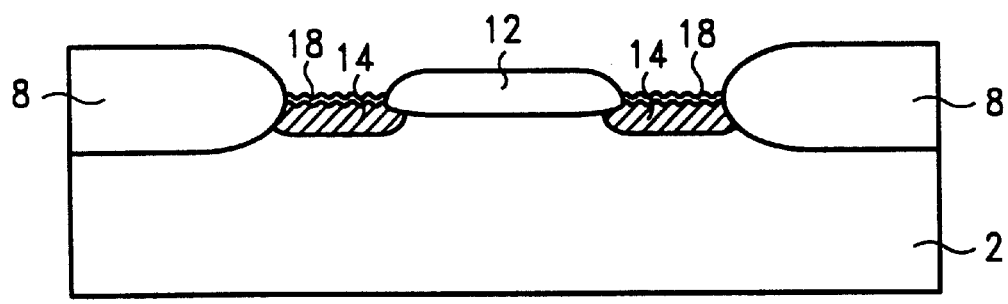
FIG. 8 is a cross-sectional view of a semiconductor wafer illustrating the step of forming a thin tunnel oxide on the rugged substrate according to the present invention.

Referring to FIG. 8, a thin oxide layer 18 is now formed on the rugged doped region 14. The thin oxide layer 18 can be formed by thermal oxidation performed in a dry oxygen ambience at a temperature of about 750–1050° C., or by a chemical vapor deposition (CVD). Alternatively, a nitridation followed by a re-oxidation can be applied to form this oxide layer 18. With underlying rugged surface of the doped substrate region, a rugged tunnel oxide 18 is then formed, and a rugged $Si/SiO_2$ interface is obtained. As mentioned by S. L. Wu et al., in "Characterization of Thin Textured Tunnel Oxide Prepared by Thermal Oxidation of Thin Polysilicon Film on Silicon", IEEE Trans. Electron Devices, Vol. 43, p. 287 (1996), this rugged interface will result in localized high electric field and subsequently enhance the electron injection from the substrate 2 into oxide. Thus, the rugged tunnel oxide exhibits higher electron-injection efficiency, a significantly lower charge trapping rate, and a large charge-to-breakdown in comparison with the conventional tunnel oxide.

Figure 9:
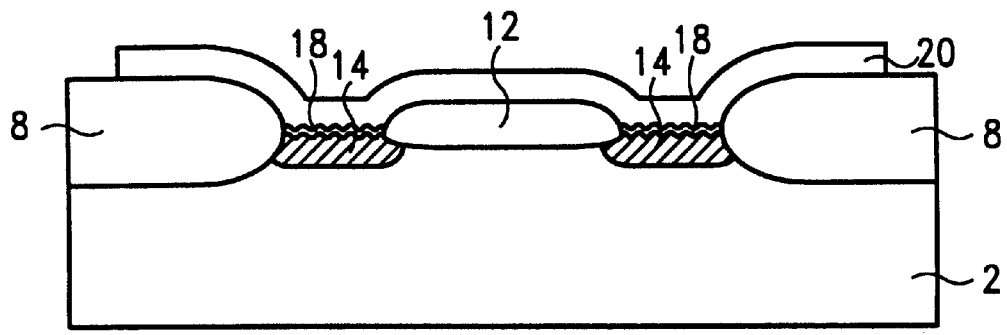
FIG. 9 is a cross-sectional view of a semiconductor wafer illustrating the step of depositing an n+ poly-Si film and then defining the floating gate according to the present invention.

Next, referring to FIG. 9, the conductive layer 20 is deposited on the substrate 2 preferably with a material of doped or in-situ doped n+ polysilicon by using a conventional LPCVD. A standard photolithography process is used to define the floating gate pattern. An anisotropic etching with $Cl_2$, HBr or $SiCl_4$ as the plasma source is then carried out to etch the conductive layer, thereby the floating gate 20 is formed on the active region and a portion of the field oxide region.

Figure 10:
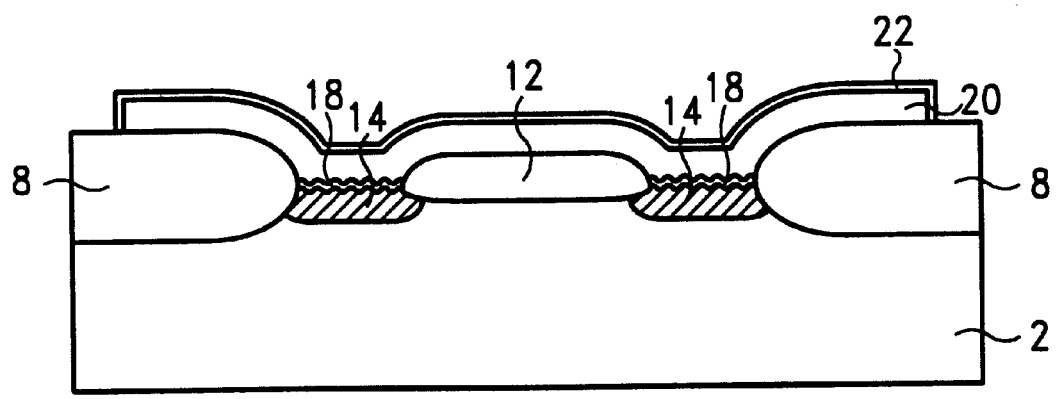
FIG. 10 is a cross-sectional view of a semiconductor wafer illustrating the step of forming an ultra-thin interpoly dielectric on the floating gate according to the present invention.
Figure 11:
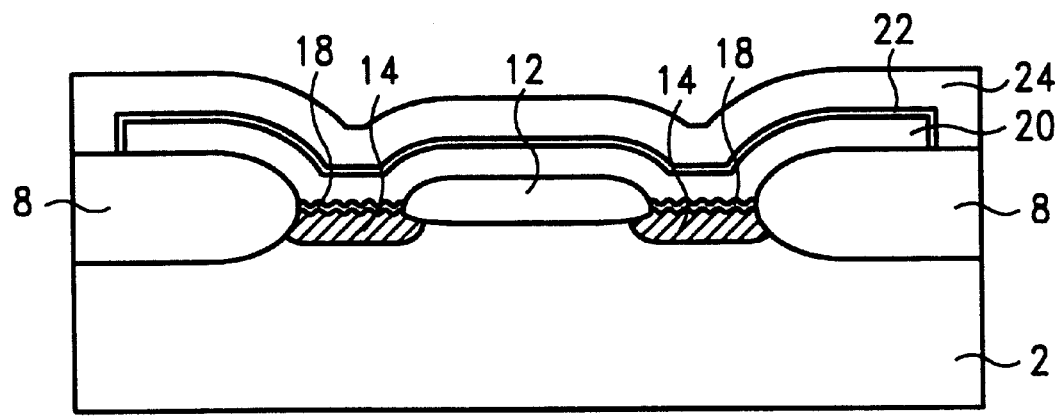
FIG. 11 is a cross-sectional view of a semiconductor wafer illustrating the step of depositing another n+ poly-Si film and then defining the control gate according to the present invention.

The ultra-thin interpoly dielectric (IPD) layer 22 deposited on the surface of the floating gate 20 is shown in FIG. 10. This interpoly dielectric layer 22 can be a material of a double film of silicon nitride and silicon oxide (NO), a triple film of silicon oxide, silicon nitride and silicon oxide (ONO), or any other high dielectric constant film such as tantalum pentoxide ($Ta_2O_5$) or barium strontium titanate (BST). Finally, referring to FIG. 11, another conductive layer formed of doped or in-situ doped n+ polysilicon is deposited and patterned on the interpoly dielectric layer 22 to serve as the control gate 24. Thus, the nonvolatile memory cell with rugged tunnel oxide is finished according to the present invention.

As is understood by a person skilled in the art, the foregoing preferred embodiments of the present invention are illustrative of the present invention rather than limiting of the present invention. They are intended to cover various modifications and similar arrangements included within the spirit and scope of the appended claims, the scope of which should be accorded the broadest interpretation so as to encompass all such modifications and similar structure.

What is claimed is:

1. A method for forming a nonvolatile memory cell with rugged tunnel oxide layers, said method comprise:

forming a silicon oxide layer on a semiconductor substrate;

forming a silicon nitride layer on said silicon oxide layer;

patterning said silicon nitride layer to define tunnel oxide regions and expose a portion of said silicon oxide layer which defines a non-tunnel region of said semiconductor substrate;

performing a first thermal oxidation to oxidize a portion of said semiconductor substrate exposed by said silicon nitride, thereby generating a non-tunnel oxide on said semiconductor substrate;

removing said silicon nitride layer;

implanting ions into said semiconductor substrate to form doped regions to serve as source and drain using said non-tunnel oxide as a mask;

performing an annealing to said semiconductor substrate and simultaneously driving said ions into said semiconductor substrate;

removing said silicon oxide layer;

forming a metal silicide layer on said doped regions of said semiconductor substrate to form a rugged interface between said metal silicide layer and said doped regions;

removing said metal silicide layer to expose a rugged surface of said doped regions;

forming oxide layers on said doped regions to serve as said rugged tunnel oxides;

forming a floating gate over said rugged tunnel oxides and said non-tunnel oxide;

forming a dielectric layer on said floating gate; and forming a control gate on said dielectric layer.

2. The method according to claim 1 wherein said semiconductor substrate is a p-type substrate.

3. The method according to claim 1, wherein said silicon oxide layer has a thickness of about 40–300 angstroms.

4. The method according to claim 1, wherein said first thermal oxidation is performed in an oxygen steam ambience at a temperature of about 800–1100° C.

5. The method according to claim 1, wherein said non-tunnel oxide has a thickness of about 300–2500 angstroms.

6. The method according to claim 1, wherein said implanted ions are n-type ions.

7. The method according to claim 6, wherein said n-type ions are selected from the group consisting of phosphoric ions, arsenic ions and antimony ions.

8. The method according to claim 6, wherein said n-type ions are implanted at about 0.5–150 keV with dosage of about $5 \times 10^{14}$–$5 \times 10^{16}$ atoms/$cm^2$.

9. The method according to claim 1, wherein said annealing is performed at a temperature of about 800–1150° C.

10. The method according to claim 1, wherein said metal silicide is formed with a metal deposition followed by a thermal process.

11. The method according to claim 10, wherein said thermal process is selected from the group consisting of high temperature annealing and rapid thermal processing (RTP).

12. The method according to claim 1, wherein said metal silicide is formed with a metal precursor selected from the group consisting of titanium (Ti), tungsten (W), tantalum (Ta), Nickel (Ni), molybdenum (Mo), and cobalt (Co).

13. The method according to claim 1, wherein said rugged tunnel oxides are formed by a second thermal oxidation.

14. The method according to claim 13, wherein said second thermal oxidation performed in a dry oxygen ambience at a temperature of about 750–1050° C.

15. The method according to claim 1, wherein said rugged tunnel oxides are formed by a chemical vapor deposition.

16. The method according to claim 1, wherein said rugged tunnel oxides are formed by a nitridation followed by a re-oxidation.

17. The method according to claim 1, wherein said floating gate is formed of doped polysilicon.

18. The method according to claim 1, wherein said dielectric layer is formed of the material selected from the group consisting of tantalum pentoxide ($Ta_2O_5$), barium strontium titanate (BST), a double film of silicon nitride and silicon oxide, and a triple film of silicon oxide, silicon nitride and silicon oxide (ONO).

19. The method according to claim 1, wherein said control gate is formed of doped polysilicon.

* * * * *